(12) United States Patent
Honma et al.

(10) Patent No.: US 10,182,500 B2
(45) Date of Patent: Jan. 15, 2019

(54) CURABLE COMPOSITION FOR PHOTOIMPRINT, CURED PRODUCT, AND METHOD OF PRODUCING FILM HAVING PATTERN, OPTICAL COMPONENT, CIRCUIT BOARD, OR ELECTRONIC COMPONENT USING THE COMPOSITION

(71) Applicant: CANON KABUSHIKI KAISHA, Tokyo (JP)

(72) Inventors: Takeshi Honma, Tokyo (JP); Toshiki Ito, Kawasaki (JP); Shiori Yonezawa, Tokyo (JP); Youji Kawasaki, Utsunomiya (JP); Akiko Iimura, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 140 days.

(21) Appl. No.: 15/121,531

(22) PCT Filed: Feb. 10, 2015

(86) PCT No.: PCT/JP2015/054193
§ 371 (c)(1),
(2) Date: Aug. 25, 2016

(87) PCT Pub. No.: WO2015/129508
PCT Pub. Date: Sep. 3, 2015

(65) Prior Publication Data
US 2016/0366769 A1 Dec. 15, 2016

(30) Foreign Application Priority Data

Feb. 26, 2014 (JP) ................. 2014-035845
May 27, 2014 (JP) ................. 2014-109340
Dec. 19, 2014 (JP) ................. 2014-257800

(51) Int. Cl.
*H05K 3/30* (2006.01)
*H05K 3/06* (2006.01)
(Continued)

(52) U.S. Cl.
CPC ........... *H05K 3/06* (2013.01); *B29C 35/0805* (2013.01); *B29C 59/02* (2013.01); *C08F 2/48* (2013.01);
(Continued)

(58) Field of Classification Search
CPC . B28B 7/346; B29C 2043/3488; B29C 43/34; B29C 70/342; H01L 21/76817;
(Continued)

(56) References Cited

U.S. PATENT DOCUMENTS

| | | | | |
|---|---|---|---|---|
| 9,957,340 | B2 * | 5/2018 | Chiba | C08F 220/18 |
| 2009/0267267 | A1 * | 10/2009 | Yoneda | B29C 37/0053 264/293 |
| 2012/0306122 | A1 | 12/2012 | Hoshino | |

FOREIGN PATENT DOCUMENTS

| | | |
|---|---|---|
| CN | 103119691 A | 5/2013 |
| CN | 104823264 A | 8/2015 |

(Continued)

OTHER PUBLICATIONS

Hiroshi Hiroshima, Quick Cavity Filling in UV Nanoimprint Using Pentafluoropropane; Japanese Journal of Applied Physics vol. No. 6, pp. 5151-5155, 2008.
(Continued)

*Primary Examiner* — Thiem Phan
(74) *Attorney, Agent, or Firm* — Canon U.S.A., Inc. IP Division

(57) ABSTRACT

In an imprint process in a gaseous atmosphere containing a condensable gas, the curable composition for photoimprint is difficult to cure, the pattern is not fully formed to cause
(Continued)

defects. The present invention relates to a curable composition for photoimprint in a gaseous atmosphere containing a condensable gas. The curable composition for photoimprint at least comprises the following component (A) and component (B):
(A) polymerizable compound, and
(B) photopolymerization initiator.
Component (B) has a saturated solubility of less than 1% by weight in the condensable gas in a liquid state at 5° C. and 1 atm or has a Hansen distance (Ra) of larger than 7.6 to the condensable gas.

24 Claims, 2 Drawing Sheets

(51) Int. Cl.
*C08F 2/48* (2006.01)
*G03F 7/00* (2006.01)
*G03F 7/029* (2006.01)
*G03F 7/031* (2006.01)
*B29C 35/08* (2006.01)
*B29C 59/02* (2006.01)
*C08F 220/10* (2006.01)
*B29L 7/00* (2006.01)

(52) U.S. Cl.
CPC ............ *G03F 7/0002* (2013.01); *G03F 7/029* (2013.01); *G03F 7/031* (2013.01); *H05K 3/30* (2013.01); *B29C 2035/0827* (2013.01); *B29L 2007/008* (2013.01); *C08F 220/10* (2013.01); *Y10T 29/4913* (2015.01)

(58) Field of Classification Search
CPC ........... Y10T 29/4913; Y10T 428/2878; Y10T 428/31855; H05K 3/245; Y10S 425/815; Y10S 438/909
USPC .............................. 29/832, 421.1, 527.1, 835
See application file for complete search history.

(56) References Cited

FOREIGN PATENT DOCUMENTS

| CN | 105493236 A | 4/2016 |
|----|-------------|--------|
| JP | 2007-084625 A | 4/2007 |
| JP | 2010-114209 A | 5/2010 |
| JP | 2011-171364 A | 9/2011 |
| JP | 2012-214022 A | 11/2012 |
| JP | 2013-122044 A | 6/2013 |
| JP | 2014-237632 A | 12/2014 |
| JP | 2015-099899 A | 5/2015 |
| TW | 201319738 A1 | 5/2013 |
| TW | 201344751 A | 11/2013 |
| WO | 2013/069511 A1 | 5/2013 |
| WO | 2014/084395 A1 | 6/2014 |

OTHER PUBLICATIONS

Shu Kaneko, Morphological Changes in Ultraviolet-Nanoimprinted Resin Patterns Caused by Ultraviolet-Curable Resins Absorbing Pentafluoropropane; Japanese Journal of Applied Physics 51 (2012) 06FJO5-6.

* cited by examiner

CURABLE COMPOSITION FOR PHOTOIMPRINT, CURED PRODUCT, AND METHOD OF PRODUCING FILM HAVING PATTERN, OPTICAL COMPONENT, CIRCUIT BOARD, OR ELECTRONIC COMPONENT USING THE COMPOSITION

TECHNICAL FIELD

The present invention relates to a curable composition for photoimprint, a cured product, and a method of producing a film having a pattern, an optical component, a circuit board, or an electronic component using the composition.

BACKGROUND ART

With the increase in requirement for miniaturization of semiconductor devices, fine processing technology involving patterning a resist (curable composition for photoimprint) on a substrate (wafer) with a mold to form a resist pattern on the substrate has been attracting attentions, in addition to known photolithography technology. The fine processing technology is also called photo-imprint technology and can form a fine structure of the order of several nanometers on a substrate. In the method using a photo-imprint apparatus, a resist is applied to a pattern-forming region on a substrate and is then patterned using a mold provided with a pattern. The resist is cured by irradiation with light and is then released. Thus, a resin pattern (photocured product) is formed on a substrate.

In the formation of a resin pattern (photocured product), it is desirable to uniformize the residual film thickness of the resin pattern (photocured product) on a substrate. For example, in production of a semiconductor device, such uniformization can prevent occurrence of an in-plane variation in line width when a dry etching is performed, for example, in an etching step, i.e., in a step other than the pattern-forming step with an imprint apparatus. PTL 1 discloses a method of uniformizing the residual film thickness of a resin pattern (photocured product) through an imprint process involving optimization of the arrangement of droplets of a resist depending on the density of the pattern for transfer when the resist is applied onto a substrate by an ink jet system. In this imprint process discretely arranging a resist on a substrate, however, since the resist hardly spreads on the substrate, air bubbles readily remain between the resist and the pattern portion of a mold pressed against the resist on the substrate. The cured resist with remaining the air bubbles has a risk of forming a resin pattern (photocured product) having an unintended shape. Alternatively, if the curing is not performed until disappearance of the air bubbles, the productivity decreases.

PTL 2 discloses a method of promoting disappearance of remaining air bubbles by introducing a condensable gas between the mold and the substrate. The condensable gas condenses by the capillary pressure generated when a resist penetrates into a gap between the resist and the mold or into a concave on the mold. Accordingly, the supplied gas condenses by the application of the resist to reduce the volume, resulting in promotion disappearance of the air bubbles. The condensable gas used in the method described in PTL 2 is trichlorofluoromethane ($CFCl_3$). In addition, NPL 1 describes an improvement in the property of filling by using 1,1,1,3,3-pentafluoropropane ($CHF_2CH_2CF_3$) as a condensable gas.

CITATION LIST

Patent Literature

PTL 1 Japanese Patent Laid-Open No. 2010-114209
PTL 2 Japanese Patent Laid-Open No. 2007-084625

Non Patent Literature

NPL 1 Japanese Journal of Applied Physics, Vol. 47, No. 6, 2008, pp. 5151-5155
NPL 2 Japanese Journal of Applied Physics, Vol. 51, 2012, 06FJ05

SUMMARY OF INVENTION

Technical Problem

Unfortunately, it has been revealed that these processes using a condensable gas have another problem: The curable composition for photoimprint using a condensable gas is difficult to cure, compared with the curable composition for photoimprint not using a condensable gas. As a result, the pattern is not fully formed, and defects readily occur.

Solution to Problem

Accordingly, a first aspect of the present invention provides a curable composition for photoimprint in a gaseous atmosphere containing a condensable gas. The curable composition at least comprises the following component (A) and component (B):
(A) polymerizable compound; and
(B) photopolymerization initiator,
where component (B) has a saturated solubility of less than 1% by weight in the condensable gas in a liquid state at 5° C. and 1 atm and/or has a Hansen distance (Ra) of larger than 7.6 to the condensable gas.

A second aspect of the present invention provides a curable composition for photoimprint in a gaseous atmosphere containing a condensable gas. The curable composition at least comprises the following component (A), component (B), and component (C):
(A) polymerizable compound;
(B) photopolymerization initiator; and
(C) sensitizer,
where component (C) has a Hansen distance (Ra) of larger than 7.6 to the condensable gas.

The present invention can provide a film, an optical component, a circuit board, and an electronic component each having a pattern having less defects by imprint technology performed in a gaseous atmosphere containing a condensable gas.

Further features of the present invention will become apparent from the following description of exemplary embodiments with reference to the attached drawings.

DESCRIPTION OF EMBODIMENTS

Figure 1:
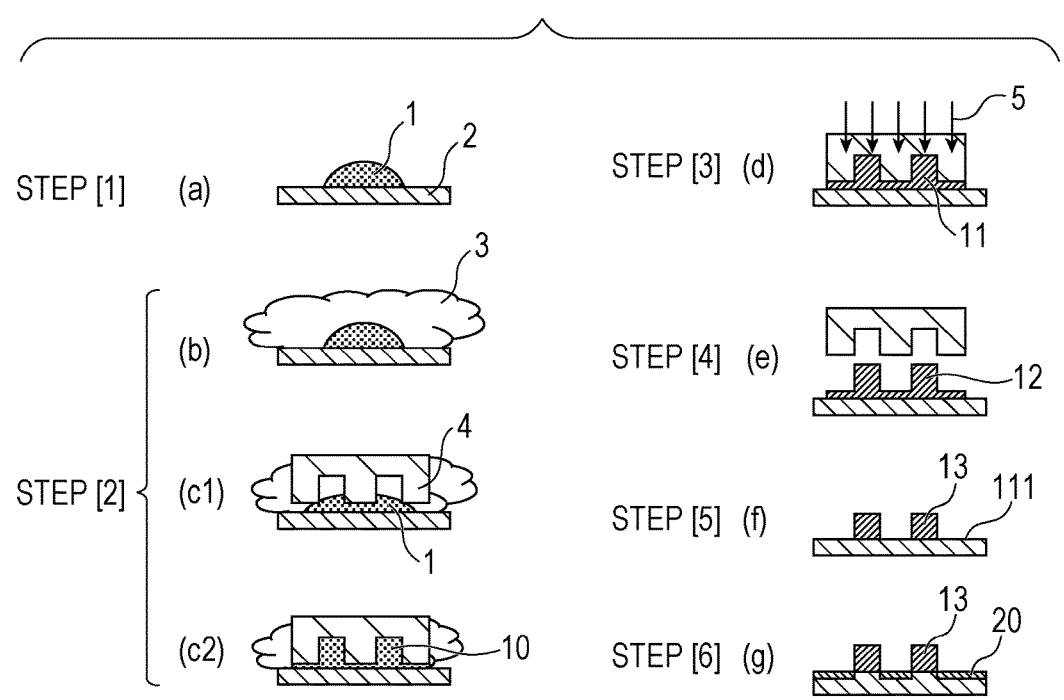
FIG. 1 includes cross-sectional views illustrating each step of a method of producing a film, an optical component, a circuit board, or an electronic component each having a pattern of an embodiment of the present invention.

Embodiments of the present invention will now be described in detail. The present invention is not limited to the following embodiments, and the embodiments can be appropriately modified and improved within the scope not departing from the gist of the present invention on the basis of knowledge of those skilled in the art. Such modifications and improvements are encompassed in the present invention.

The curable composition for photoimprint of this embodiment has two aspects. The curable composition of a first aspect is for photoimprint in a gaseous atmosphere containing a condensable gas and at least comprises the following component (A) and component (B):
(A) polymerizable compound; and
(B) photopolymerization initiator,
where component (B) has a saturated solubility of less than 1% by weight in the condensable gas in a liquid state at 5° C. and 1 atm and/or has a Hansen distance (Ra) of larger than 7.6 to the condensable gas.

The curable composition of a second aspect is for photoimprint in a gaseous atmosphere containing a condensable gas and at least comprises the following component (A), component (B), and component (C):
(A) polymerizable compound;
(B) photopolymerization initiator; and
(C) sensitizer,
where component (C) has a Hansen distance (Ra) of larger than 7.6 to the condensable gas.

Each component will now be described in detail. Component (A): Polymerizable Compound Component (A) is a polymerizable compound.

The polymerizable compound, component (A), reacts with a polymerizing factor (such as a radical) generated from a photopolymerization initiator (component (B)) and forms a polymer compound film through a chain reaction (polymerization reaction).

Component (A) may be a single polymerizable compound or a combination of two or more polymerizable compounds.

Examples of the polymerizable compound include radical polymerizable compounds. The radical polymerizable compounds can be compounds each having one or more acryloyl or methacryloyl groups, i.e., (meth)acrylic compounds.

Accordingly, the polymerizable compound can contain a (meth)acrylic compound. The polymerizable compound can be mainly composed of a (meth)acrylic compound or can be a (meth)acrylic compound. Herein, "a polymerizable compound mainly composed of a (meth)acrylic compound" means a polymerizable compound including at least 90% by weight of a (meth)acrylic compound.

The radical polymerizable compound composed of two or more compounds each having one or more acryloyl or methacryloyl groups can contain a monofunctional (meth)acrylic monomer and a polyfunctional (meth)acrylic monomer. A combination of a monofunctional (meth)acrylic monomer and a polyfunctional (meth)acrylic monomer can provide a cured film having a high strength.

Examples of the monofunctional (meth)acrylic compound having one acryloyl or methacryloyl group include, but not limited to, phenoxyethyl (meth)acrylate, phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth) acrylate, 3-(2-phenylphenyl)-2-hydroxypropyl (meth)acrylate, EO-modified p-cumylphenol (meth)acrylate, 2-bromophenoxyethyl (meth)acrylate, 2,4-dibromophenoxyethyl (meth)acrylate, 2,4,6-tribromophenoxyethyl (meth)acrylate, EO-modified phenoxy (meth)acrylate, PO-modified phenoxy (meth)acrylate, polyoxyethylene nonylphenyl ether (meth)acrylate, isobornyl (meth)acrylate, 1-adamantyl (meth)acrylate, 2-methyl-2-adamantyl (meth) acrylate, 2-ethyl-2-adamantyl (meth)acrylate, bornyl (meth) acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloyl morpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth) acrylate, isobutyl (meth)acrylate, t-butyl (meth)acrylate, pentyl (meth)acrylate, isoamyl (meth)acrylate, hexyl (meth) acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth) acrylate, benzyl (meth)acrylate, tetrahydrofurfuryl (meth) acrylate, butoxyethyl (meth)acrylate, ethoxydiethylene glycol (meth)acrylate, polyethylene glycol mono(meth) acrylate, polypropylene glycol mono(meth)acrylate, methoxyethylene glycol (meth)acrylate, ethoxyethyl (meth) acrylate, methoxypolyethylene glycol (meth)acrylate, methoxypolypropylene glycol (meth)acrylate, diacetone (meth)acrylamide, isobutoxymethyl (meth)acrylamide, N,N-dimethyl (meth)acrylamide, t-octyl (meth)acrylamide, dimethylaminoethyl (meth)acrylate, diethylaminoethyl (meth)acrylate, 7-amino-3,7-dimethyloctyl (meth)acrylate, N,N-diethyl (meth)acrylamide, and N,N-dimethylaminopropyl (meth)acrylamide.

Examples of commercially available products of the monofunctional (meth)acrylic compound include, but not limited to, Aronix series M101, M102, M110, M111, M113, M117, M5700, TO-1317, M120, M150, and M156 (manufactured by Toagosei Co., Ltd.), MEDOL 10, MIBDOL 10, CHDOL 10, MMDOL 30, MEDOL 30, MIBDOL 30, CHDOL 30, LA, IBXA, 2-MTA, HPA, and Viscoat series #150, #155, #158, #190, #192, #193, #220, #2000, #2100, and #2150 (manufactured by Osaka Organic Chemical Industry Ltd.), Light Acrylate series BO-A, EC-A, DMP-A, THF-A, HOP-A, HOA-MPE, HOA-MPL, PO-A, P-200A, NP-4EA, and NP-8EA, and Epoxy Ester M-600A (manufactured by Kyoeisha Chemical Co., Ltd.), KAYARAD series TC110S, R-564, and R-128H (manufactured by Nippon Kayaku Co., Ltd.), NK Ester series AMP-10G and AMP-20G (manufactured by Shin-Nakamura Chemical Co., Ltd.), FA series 511A, 512A, and 513A (manufactured by Hitachi Chemical Company, Ltd.), PHE, CEA, PHE-2, PHE-4, BR-31, BR-31M, and BR-32 (manufactured Daiichi Kogyo Seiyaku Co., Ltd.), VP (manufactured by BASF), and ACMO, DMAA, and DMAPAA (manufactured by Kohjin Co., Ltd.).

Examples of the polyfunctional (meth)acrylic compound having at least two acryloyl or methacryloyl groups include, but not limited to, trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, dimethyloltricyclodecane diacrylate, pentaerythritol tri(meth)acrylate, pentaerythritol tetra(meth) acrylate, ethylene glycol di(meth)acrylate, tetraethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, 1,3-adamantanedimethanol diacrylate, 1,9-nonanediol diacrylate, 1,10-decanediol diacrylate, o-xylylene di(meth)acrylate, m-xylylene di(meth)acrylate, p-xylylene di(meth)acrylate, tris(2-hydroxyethyl) isocyanurate tri(meth)acrylate, tris(acryloyloxy) isocyanurate, bis(hydroxymethyl)tricyclodecane di(meth) acrylate, dipentaerythritol penta(meth)acrylate, dipentaerythritol hexa(meth)acrylate, EO-modified 2,2-bis (4-((meth)acryloxy)phenyl)propane, PO-modified 2,2-bis(4-((meth)acryloxy)phenyl)propane, and EO,PO-modified 2,2-bis(4-((meth)acryloxy)phenyl)propane.

Examples of commercially available products of the polyfunctional (meth)acrylic compound include, but not limited to, Yupimer series UV SA1002 and SA2007 (manufactured by Mitsubishi Chemical Corporation), Viscoat series #195, #230, #215, #260, #335HP, #295, #300, #360, and #700, GPT, and 3PA (manufactured by Osaka Organic Chemical Industry Ltd.), Light Acrylate series 4EG-A, 9EG-A, NP-A, DCP-A, BP-4EA, BP-4PA, TMP-A, PE-3A, PE-4A, and DPE-6A (manufactured by Kyoeisha Chemical Co., Ltd.), A-DCP, A-HD-N, A-NOD-N, and A-DOD-N (manufactured by Shin-Nakamura Chemical Co., Ltd.), KAYARAD PET-30, TMPTA, R-604, DPHA, DPCA-20, DPCA-30, DPCA-60, DPCA-120, HX-620, D-310, and D-330 (manufactured by Nippon Kayaku Co., Ltd.), Aronix series M208, M210, M215, M220, M240, M305, M309, M310, M315, M325, and M400 (manufactured by Toagosei Co., Ltd.), and Ripoxy series VR-77, VR-60, and VR-90 (manufactured by Showa Denko K.K.).

In the above-mentioned groups of compounds, the term "(meth)acrylate" refers to an acrylate and a methacrylate having an alcohol residue equivalent to that of the acrylate; the term "(meth)acryloyl group" refers to an acryloyl group and a methacryloyl group having an alcohol residue equivalent to that of the acryloyl group; the term "EO" refers to ethylene oxide, and the term "EO-modified compound A" refers to that the (meth)acrylic acid residue and the alcohol residue of compound A are bound to each other via a block structure of an ethylene oxide group; and the term "PO" refers to propylene oxide, and the term "PO-modified compound B" refers to that the (meth)acrylic acid residue and the alcohol residue of compound B are bound to each other via a block structure of a propylene oxide group.

Component (A) can have a large Hansen distance (Ra) to the condensable gas. The Hansen distance (Ra) between component (A) and a condensable gas is defined by Expression (a):

$$Ra=(4(\delta dm-\delta dc)^2+(\delta pm-\delta pc)^2+(\delta hm-\delta hc)^2)^{1/2} \quad (a)$$

where δdm, δpm, and δhm [(MPa)½] respectively represent Hansen solubility parameters, the dispersion, polarity, and hydrogen bond terms of component (A); and δdc, δpc, and δhc [(MPa)½] respectively represent Hansen solubility parameters, the dispersion, polarity, and hydrogen bond terms of the condensable gas.

The Hansen solubility parameter can be calculated from the chemical structure with software: Hansen Solubility Parameters in Practice (HSPiP), 4th Edition 4.0.05, for example.

For example, the Hansen solubility parameters (dispersion, polarity, and hydrogen bond terms) of butyl acetate are respectively 15.8, 4.7, and 5.8 [(MPa)½].

The Hansen solubility parameters (dispersion, polarity, and hydrogen bond terms) of 1,1,1,3,3-pentafluoropropane ($CHF_2CH_2CF_3$, HFC-245fa, or PFP) are respectively 16, 3, and 9 [(MPa)½]. The Hansen distance (Ra) is calculated from these values.

The Hansen distance (Ra) between material A and material B is an index showing the compatibility between material A and material B. A larger Hansen distance means a lower compatibility between material A and material B.

The Hansen distance (Ra) between component (A) and the condensable gas can be 4.0 or more, in particular 5.0 or more. When the condensable gas is PFP, examples of the monomer as component (A) showing a Hansen distance (Ra) of 4.0 or more include phenoxyethyl acrylate, isobornyl acrylate, 1-adamantyl acrylate, 2-methyl-2-adamantyl acrylate, 2-ethyl-2-adamantyl acrylate, dicyclopentanyl acrylate, 2-hydroxyethyl acrylate, lauryl acrylate, stearyl acrylate, isostearyl acrylate, benzyl acrylate, dimethyloltricyclodecane diacrylate, 1,9-nonanediol diacrylate, 1,10-decanediol diacrylate, o-xylylene diacrylate, m-xylylene diacrylate, and p-xylylene diacrylate.

When component (A) is a combination of two or more monomers, the Hansen distance is calculated based on the mixture ratio. For example, when monomer X (Ra(X)), monomer Y (Ra(Y)), and monomer Z (Ra(Z)) are mixed at a ratio of x:y:z, the Hansen distance (Ra) is calculated by Expression (b):

$$Ra=(x*Ra(X)+y*Ra(Y)+z*Ra(Z))/(x+y+z) \quad (b)$$

The composition ratio of the monomers is controlled such that Expression (b) satisfies the above-described relationship.

Among the above-mentioned compounds, component (A) can contain at least one, or at least two, of isobornyl acrylate, benzyl acrylate, neopentylglycol diacrylate, 1,10-decanediol diacrylate, dicyclopentanyl acrylate, and m-xylylene diacrylate. Alternatively, component (A) can be composed of isobornyl acrylate, benzyl acrylate, and neopentylglycol diacrylate or can be composed of isobornyl acrylate and 1,10-decanediol diacrylate or can be composed of dicyclopentanyl acrylate and m-xylylene diacrylate.

Component (B): Photopolymerization Initiator

Component (B) is a photopolymerization initiator.

In the present invention and this embodiment, the photopolymerization initiator perceives light of a predetermined wavelength and generates a polymerizing factor (radical). Specifically, the photopolymerization initiator is a polymerization initiator (radical generator) generating radicals by light (infrared rays, visible rays, ultraviolet rays, far ultraviolet rays, X-rays, charged particle rays such as electron beams, or radiation rays), more specifically, a polymerization initiator generating radicals by light having, for example, a wavelength of 200 to 500 nm.

The photopolymerization initiator component (B) has a saturated solubility of less than 1% by weight in the condensable gas in a liquid state at 5° C. and 1 atm and/or has a Hansen distance (Ra) of larger than 7.6 to the condensable gas. Although component (B) may be a compound satisfying either or both of the requirements of having a saturated solubility of less than 1% by weight in the condensable gas in a liquid state and having a Hansen distance (Ra) of larger than 7.6 to the condensable gas. In particular, component (B) can be a compound satisfying both requirements (a saturated solubility of less than 1% by weight in the condensable gas in a liquid state at 5° C. and 1 atm and a Hansen distance (Ra) of larger than 7.6 to the condensable gas).

The "saturated solubility" herein is measured by the following method.

An arbitrary amount of a photopolymerization initiator is weighed in a sample bottle at 23° C., and a condensable gas cooled to 5° C. to a liquid state is gradually added to the bottle until the photopolymerization initiator is completely dissolved. The sample bottle is capped and is left to stand in a refrigerator at 5° C. for 1 hour. The sample bottle is then subjected to visual observation whether the photopolymerization initiator is completely dissolved. The weight of the weighed photopolymerization initiator is divided by the sum of the weight of the photopolymerization initiator and the weight of the condensable gas in a liquid state, and the resulting quotient is expressed in percentage as the saturated solubility.

Herein, the Hansen distance (Ra) between component (B) and a condensable gas is defined by Expression (a):

$$Ra = (4(\delta dp - \delta dc)^2 + (\delta pp - \delta pc)^2 + (\delta hp - \delta hc)^2)^{1/2} \quad (a)$$

In Expression (a), $\delta dp$, $\delta pp$, and $\delta hp$ [(MPa)½] respectively represent Hansen solubility parameters, the dispersion, polarity, and hydrogen bond terms of component (B); and $\delta dc$, $\delta pc$, and $\delta hc$ [(MPa)½] respectively represent Hansen solubility parameters, the dispersion, polarity, and hydrogen bond terms of the condensable gas.

Component (B) having a saturated solubility of less than 1% by weight in the condensable gas in a liquid state at 5° C. and 1 atm or having a Hansen distance (Ra) of larger than 7.6 to the condensable gas can prevent incomplete curing of the curable composition for photoimprint in the imprint process in a condensable gas atmosphere described below and gives a pattern having reduced defects.

The reason of this is presumed as follows.

In the method of producing a film having a pattern using the curable composition for photoimprint of this embodiment, described below, the condensable gas being present in the periphery of the curable composition for photoimprint is dissolved in the curable composition in the mold contact step [2] for bringing a mold into contact with the curable composition in a gaseous atmosphere containing the condensable gas. For example, it is known that about 40% by volume of PFP described below is dissolved in a curable composition for photoimprint mainly composed of an acrylic monomer (NPL 2).

It is believed that since the condensable gas dissolved in the curable composition for photoimprint is a nonpolymerizing component, the condensable gas prevents the polymerization initiation reaction of component (B) to cause pattern defects due to incomplete curing. That is, it is believed that a high compatibility between component (B) and the condensable gas allows component (B) to be surrounded by a larger amount of the condensable gas and that polymerization is thereby readily inhibited. As described below, when the gas containing a condensable gas is a gas mixture of the condensable gas and a noncondensable gas, the noncondensable gas can be an inert gas. If the noncondensable gas is an inert gas, the component other than the condensable gas in the gas containing the condensable gas hardly inhibits the polymerization reaction.

Accordingly, it is believed that the compatibility between component (B) and the condensable gas is reduced by using component (B) having a saturated solubility of less than 1% by weight in the condensable gas in a liquid state at 5° C. and 1 atm or having a Hansen distance (Ra) of larger than 7.6 to the condensable gas and that consequently, the curable composition for photoimprint is prevented from incomplete curing to reduce defects of the pattern. The Hansen distance (Ra) between component (B) and the condensable gas can be 8.7 or more, such as 8.7 or more and 9.4 or less.

Component (B) may be a single photopolymerization initiator or a combination of two or more photopolymerization initiators.

The blending ratio of the polymerization initiator component (B) in the curable composition for photoimprint is 0.01% by weight or more and 20% by weight or less, preferably 0.1% by weight or more and 1% by weight or less, based on the total weight of component (A).

A blending ratio of the polymerization initiator of 0.01% by weight or more based on the total weight of component (A) can prevent a reduction in reaction efficiency due to a reduction in curing rate. A blending ratio of the polymerization initiator of 20.0% by weight or less based on the total weight of component (A) can prevent deterioration in the mechanical strength of a cured product of the curable composition for photoimprint in many cases.

Examples of component (B) include benzophenone compounds, acylphosphine oxide compounds, and aminoalkylphenone compounds. The acylphosphine oxide compound can be particularly 2,4,6-trimethylbenzoyldiphenylphosphine oxide represented by Formula (1):

[Chem. 1]

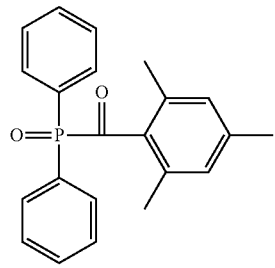

Formula (1)

The aminoalkylphenone compound can be particularly 2-benzyl-2-dimethylamino-4'-morpholinobutyrophenone represented by Formula (2):

[Chem. 2]

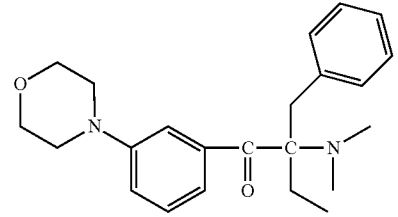

Formula (2)

Component (C): Sensitizer

Component (C) is a sensitizer.

The curable composition for photoimprint containing the sensitizer component (C) can accelerate the polymerization reaction of component (A) and improve the reaction conversion rate. The sensitizer is, for example, a sensitizing dye.

The sensitizing dye is a compound that is excited by absorbing light of a specific wavelength and interacts with the polymerization initiator component (B). The interaction herein is, for example, energy transfer or electron transfer from the sensitizing dye in the excited state to the polymerization initiator component (B).

Examples of the sensitizing dye include anthracene derivatives, anthraquinone derivatives, pyrene derivatives, perylene derivatives, carbazole derivatives, benzophenone derivatives, thioxanthone derivatives, xanthone derivatives, coumarin derivatives, phenothiazine derivatives, camphorquinone derivatives, acridine dyes, thiopyrylium salt dyes, merocyanine dyes, quinoline dyes, styrylquinoline dyes, ketocoumarin dyes, thioxanthene dyes, xanthene dyes, oxonol dyes, cyanine dyes, rhodamine dyes, and pyrylium salt dyes.

The curable composition for photoimprint may contain a single sensitizer or two or more sensitizers.

The present inventors have found that, as in component (B), when the Hanse distance (Ra) between compound (C) and the condensable gas is larger than 7.6, incomplete curing of the curable composition for photoimprint is prevented to reduce the defects of the pattern in the imprint process performed in a condensable gas atmosphere described below.

The sensitizer can be particularly a benzophenone compound (benzophenone derivative) or thioxanthone compound (thioxanthone derivative).

The above-mentioned benzophenone compound is, for example, a 4,4'-bis(dialkylamino)benzophenone.

The above-mentioned thioxanthone compound is, for example, 2-isopropylthioxanthone represented by Formula (3):

[Chem. 3]

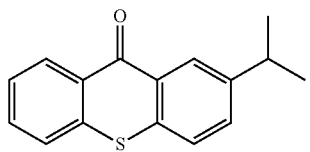

Formula (3)

In particular, the sensitizer can be 4,4'-bis(diethylamino) benzophenone represented by Formula (4):

[Chem. 4]

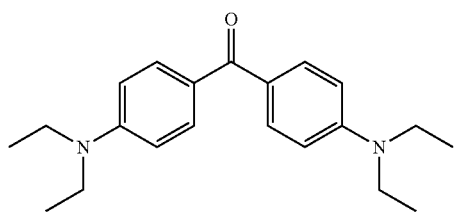

Formula (4)

or 2-isopropylthioxanthone represented by Formula (3):

[Chem. 5]

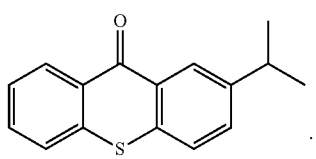

Formula (3)

Table 1 shows Hansen distance (Ra) between each component (C) and a condensable gas PFP.

TABLE 1

Hansen distance (Ra) and saturated solubility to PFP ($\delta df = 16, \delta pf = 3, \delta hf = 9$)

| No. | Component | Hansen distance Ra | Saturated solubility (% by weight) |
|---|---|---|---|
| Formula (1) | B | 9.4 | <1.0 |
| Formula (2) | B | 8.7 | <1.0 |
| Formula (3) | C | 9.7 | <1.0 |
| Formula (4) | C | 7.8 | <1.0 |
| Formula (6) | B | 7.6 | >1.0, <3.0 |

Other Components

The curable composition for photoimprint in this embodiment may further contain additional components according to various purposes within a range that does not impair the effects of the present invention, in addition to the above-described polymerizable compound component (A) and photopolymerization initiator component (B). Examples of the additional components include surfactants, sensitizers, hydrogen donors, antioxidants, solvents, and polymer components.

The curable composition for photoimprint containing a surfactant can reduce the interface bonding force between a mold and a cured product. In the present invention, the surfactant is nonpolymerizable.

The surfactant can be a silicone surfactant, a fluorine surfactant, or a hydrocarbon surfactant. From the viewpoint of an excellent effect of reducing the mold-releasing force, a fluorine surfactant can be used. Examples of the fluorine surfactant include polyalkylene oxide (e.g., polyethylene oxide or polypropylene oxide) adducts of alcohols having perfluoroalkyl groups and polyalkylene oxide (e.g., polyethylene oxide or polypropylene oxide) adducts of perfluoropolyethers. The fluorine surfactant may have, for example, a hydroxyl group, an alkyl group, an amino group, or a thiol group at a part of the molecular structure (e.g., terminal group). The surfactant may be a commercially available one. Examples of the hydrocarbon surfactant include polyalkylene oxide adducts of alkyl alcohols in which alkylene oxide having 2 to 4 carbon atoms is added to alkyl alcohol having 1 to 50 carbon atoms.

Examples of the polyalkylene oxide adducts of alkyl alcohols include an ethylene oxide adduct of methyl alcohol, an ethylene oxide adduct of decyl alcohol, an ethylene oxide adduct of lauryl alcohol, an ethylene oxide adduct of cetyl alcohol, an ethylene oxide adduct of stearyl alcohol, and an ethylene oxide/propylene oxide adduct of stearyl alcohol. The terminal group of the polyalkylene oxide adduct of alkyl alcohol is not limited to a hydroxyl group, which can be produced by merely adding a polyalkylene oxide to an alkyl alcohol. The hydroxyl group may be substituted by another substituent, e.g., a polar functional group such as a carboxyl group, an amino group, a pyridyl group, a thiol group, or a silanol group; or a hydrophobic functional group such as an alkyl group.

The polyalkylene oxide adduct of alkyl alcohol may be a commercially available one. Examples of the commercially available adduct include polyoxyethylene methyl ether (ethylene oxide adduct of methyl alcohol) (BLAUNON MP-400, BLAUNON MP-550, BLAUNON MP-1000) manufactured by Aoki Oil Industrial Co., Ltd.; polyoxyethylene decyl ether (ethylene oxide adduct of decyl alcohol) (FINESURF D-1303, FINESURF D-1305, FINESURF D-1307, FINESURF D-1310) manufactured by Aoki Oil Industrial Co., Ltd.; polyoxyethylene lauryl ether (ethylene oxide adduct of lauryl alcohol) (BLAUNON EL-1505) manufactured by Aoki Oil Industrial Co., Ltd.; polyoxyethylene cetyl ether (ethylene oxide adduct of cetyl alcohol) (BLAUNON CH-305, BLAUNON CH-310) manufactured by Aoki Oil Industrial Co., Ltd.; and polyoxyethylene stearyl ether (ethylene oxide adduct of stearyl alcohol) (BLAUNON SR-705, BLAUNON SR-707, BLAUNON SR-715, BLAUNON SR-720, BLAUNON SR-730, BLAUNON SR-750) manufactured by Aoki Oil Industrial Co., Ltd.

The surfactants may be used alone or in combination of two or more thereof.

When the curable composition for photoimprint of this embodiment contains a surfactant, the content of the surfactant is, for example, 0.001% by weight or more and 10% by weight or less, preferably 0.01% by weight or more and 7% by weight or less, and more preferably 0.05% by weight or more and 5% by weight or less, based on the total weight of the polymerizable compound component (A). A content of the surfactant in the range of 0.001% by weight or more and 10% by weight or less can enhance the mold-releasing property of the cured product of the curable composition and can allow the curable composition to readily fill the concavo-convex surface of the mold.

The hydrogen donor is a compound that reacts with an initial radical generated from the polymerization initiator component (B) or with a radical of the polymerization growth terminal and generates a radical having higher reactivity. The hydrogen donor is added to the curable composition for photoimprint, in particular, when the polymerization initiator component (B) is a photo-radical generator.

Examples of the hydrogen donor include amine compounds such as N-butylamine, di-n-butylamine, tri-n-butylphosphine, allylthiourea, s-benzylisothiuronium-p-toluene sulfinate, triethylamine, diethylaminoethyl methacrylate, triethylenetetramine, 4,4'-bis(dialkylamino)benzophenones, N,N-dimethylaminobenzoic acid ethyl ester, N,N-dimethylaminobenzoic acid isoamyl ester, pentyl-4-dimethylamino benzoate, triethanolamine, and N-phenylglycine; and mercapto compounds such as 2-mercapto-N-phenylbenzimidazole and mercaptopropionic acid ester.

The curable composition for photoimprint may contain a single hydrogen donor or two or more hydrogen donors.

The hydrogen donor may have a function as a sensitizer. Examples of the hydrogen donor having a function as a sensitizer include 4,4'-bis(dialkylamino)benzophenones.

Examples of the 4,4'-bis(dialkylamino)benzophenone include 4,4'-bis(diethylamino)benzophenone and its derivatives. In the present invention and the specification, the term "derivative of compound A" refers to a compound derived from compound A. A derivative of compound A is, for example, a compound resulting from addition of a substituent to compound A. The hydrogen donor having a function as a sensitizer can be particularly 4,4'-bis(diethylamino) benzophenone represented by Formula (4):

[Chem. 6]

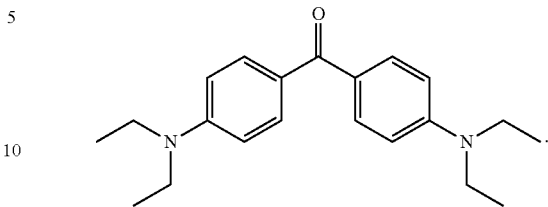

Formula (4)

When the curable composition for photoimprint of this embodiment contains a sensitizer component (C) or a hydrogen donor, the amount of each of the sensitizer component (C) and the hydrogen donor is preferably 0.1% by weight or more and 20% by weight or less, more preferably 0.1% by weight or more and 5.0% by weight or less, and most preferably 0.2% by weight or more and 2.0% by weight or less, based on the total weight of the polymerizable compound component (A). A sensitizer component (C) in an amount of 0.1% by weight or more based on the total weight of component (A) can more effectively accelerate the polymerization. A sensitizer component (C) or hydrogen donor in a content of 5.0% by weight or less can sufficiently increase the molecular weight of the polymer compound constituting the photocured product produced by curing of the curable composition and can prevent insufficient dissolution and deterioration in storage stability of the curable composition.

Temperature of Curable Composition for Photoimprint During Mixing

The curable composition for photoimprint of this embodiment is prepared by mixing and dissolving at least component (A), component (B), and component (C) at predetermined temperature, specifically, within a range of 0° C. or more and 100° C. or less.

Viscosity of Curable Composition for Photoimprint

The viscosity at 23° C. of a mixture of the components excluding the solvent in the curable composition for photoimprint of this embodiment is preferably 1 cP or more and 100 cP or less, more preferably 5 cP or more and 50 cP or less, and most preferably 6 cP or more and 20 cP or less.

A viscosity of the curable composition for photoimprint of 100 cP or less allows the curable composition to fill the concavities of the fine pattern on a mold within a short period of time in the contact step of bringing the mold into contact with the curable composition, described below, and prevents pattern defects due to filling failure.

A viscosity of 1 cP or more prevents uneven coating in the arrangement step of arranging the curable composition for photoimprint onto a substrate, described below, and prevents the curable composition from flowing out from the end of a mold in the contact step of bringing the mold into contact with the composition, described below.

Surface Tension of Curable Composition for Photoimprint

The surface tension at 23° C. of a mixture of the components excluding the solvent in the curable composition for photoimprint of this embodiment is preferably 5 mN/m or more and 70 mN/m or less, more preferably 7 mN/m or more and 35 mN/m or less, and most preferably 10 mN/m or more and 32 mN/m or less.

A surface tension of 5 mN/m or more allows the curable composition for photoimprint to fill the concavities of the fine pattern on a mold within a short period of time in the contact step of bringing the mold into contact with the curable composition, described below.

A surface tension of 70 mN/m or less readily provides smoothness to the surface of the resulting photocured product.

Impurities in Curable Composition for Photoimprint

The curable composition for photoimprint can be subjected to a purification step. The purification step can be, for example, filtration through a filter.

The filtration with a filter can be performed by, specifically, filtering a mixture of component (A), component (B), component (C), and other optional components described above through, for example, a filter having a pore diameter of 0.001 μm or more and 5.0 μm or less. The filtration through a filter can be multi-stage filtration or may be repeated multiple times. The filtrate may be re-filtered. The filtration may be performed through a plurality of filters having different pore diameters. The filter for the filtration may be any filter, and examples of the material of the filter include, but not limited to, polyethylene resins, polypropylene resins, fluorine resins, and nylon resins.

Such a purification step can reduce impurities such as particles contaminating the curable composition for photoimprint. As a result, pattern defects caused by careless generation of irregularity, due to impurities such as particles, in a photocured product produced by curing of the curable composition can be prevented from occurring in many cases.

In a case of using the curable composition for photoimprint of this embodiment for producing a semiconductor integrated circuit, contamination of the curable composition by impurities (metal impurities) having metal atoms should be prevented as much as possible, in order not to obstruct the behavior of the product. Accordingly, the concentration of metal impurities contained in the curable composition for photoimprint should be 10 ppm or less, preferably 100 ppb or less.

Examples of Composition

The curable composition for photoimprint can comprise component (B) having a Hansen distance (Ra) of larger than 7.6 to the condensable gas and component (C) having a Hansen distance (Ra) of larger than 7.6 to the condensable gas.

In this embodiment, the condensable gas is prevented from inhibiting the polymerization initiation reaction of component (B) and the sensitization of the sensitizer component (C), and the main component, component (A), may have any Hansen distance (Ra) to the condensable gas. For example, the Hansen distance (Ra) between component (A) and the condensable gas can be 4.0 or more or 5.0 or more.

A method of producing a film having a pattern of this embodiment will now be described.

FIG. 1 includes schematic cross-sectional views illustrating an example of a method of producing a film having a pattern of this embodiment.

The method of producing a film having a pattern of this embodiment comprises:

an arrangement step [1] of arranging the curable composition for photoimprint of the embodiment described above on a substrate;

a mold contact step [2] of bringing a mold into contact with the curable composition for photoimprint in a gaseous atmosphere containing a condensable gas;

a light irradiation step [3] of irradiating the curable composition with light; and a mold-releasing step [4] of releasing the mold from the cured product prepared in the step [3].

Although the method of producing a film having a pattern of this embodiment is a photoimprint process, the method of producing a film having a pattern of the present invention is not limited to the photoimprint process and may be a thermal imprint process. The method of producing a film having a pattern of the present invention by a photoimprint process can produce a film having a nanosize pattern.

The film prepared by the method of producing a film having a pattern of this embodiment can have a pattern having a size of 1 nm or more and 10 mm or less, in particular, 10 an or more and 100 μm or less.

Each step will now be described.

Arrangement Step [1]

This step (arrangement step) forms a coating film by, as shown in FIG. 1 (a), arranging the curable composition 1 for photoimprint of this embodiment described above on a substrate 2. Since the curable composition 1 is a liquid composition, this step can also be referred to as an application step.

The substrate 2 on which the curable composition 1 is arranged can be appropriately determined depending on the purpose of the photocured product 11 produced by the method of this embodiment.

Specifically, when the photocured product 11 is used as a mask for processing a substrate, the substrate 2 shown in FIG. 1 (a) is, for example, a substrate for a semiconductor device. The substrate for a semiconductor device is, for example, a silicon wafer substrate. The substrate 2 may be, for example, an aluminum, titanium-tungsten alloy, aluminum-silicon alloy, aluminum-copper-silicon alloy, silicon oxide, or silicon nitride substrate, instead of the silicon wafer substrate. The substrate 2 for a semiconductor device may be a substrate made of any material mentioned above and provided with surface treatment, such as silane coupling treatment, silazane treatment, or formation of an organic film, for improving the adhesion with the curable composition 1 for photoimprint.

When the substrate 2 is a light-transmissive substrate, specifically, a transparent substrate such as a glass substrate, the patterned cured product produced by the steps [1] to [4] can also be used as an optical member.

The curable composition 1 for photoimprint of this embodiment can be arranged on a substrate 2 by, for example, ink jetting, dip coating, air knife coating, curtain coating, wire bar coating, gravure coating, extrusion coating, spin coating, or slit scanning. Although the thickness of the layer (coating film) to be subjected to shape transfer varies depending on the purpose, it can be, for example, 0.01 or more and 100 μm or less.

The curable composition 1 for photoimprint of this embodiment is arranged on the substrate 2, for example, in the mode [1-1] or [1-2] mentioned below, in particular, in the arrangement mode [1-1]. These arrangement modes can give a uniform thickness to a cured film having a pattern or the residual film of a patterned cured product, but the method of producing a film having a pattern of the present invention is not limited to these modes.

Mode [1-1]: droplets of the curable composition 1 for photoimprint are arranged apart from one another.

Mode [1-2]: the curable composition 1 for photoimprint is arranged on the whole surface of the substrate 2.

When mode [1-1] is employed, the droplets for the coating film of the curable composition 1 for photoimprint that are arranged (applied) on the substrate 2 have a size, for example, a micron order or submicron order, but in the present invention, the size is not limited thereto.

When mode [1-2] is employed, the coating film of the curable composition 1 for photoimprint that is arranged (applied) on the substrate 2 has a cured thickness of, for example, 1 nm or more and 100 m or less, which varies depending on the purpose.

Mold contact step [2] of bringing mold into contact with curable composition for photoimprint in a gaseous atmosphere containing a condensable gas Subsequently, the coating film of the curable composition 1 for photoimprint formed in the previous step (arrangement step) is brought into contact with a mold having a mold pattern for transfer in a gaseous atmosphere containing a condensable gas.

This step includes stages [2-1] to [2-3] as shown in FIG. 1 (b) to (c2).

Stage [2-1] of Supplying a Gas Containing a Condensable Gas

In this stage (condensable gas-supplying stage), as shown in FIG. 1 (b), a gas 3 containing a condensable gas in a gaseous state and having a pressure lower than the vapor pressure or a temperature higher than the boiling point is supplied to the vicinity of the curable composition 1 for photoimprint of this embodiment arranged on the substrate 2 such that the curable composition 1 on the substrate 2 is surrounded by a gaseous atmosphere containing the condensable gas.

In the present invention and the specification, the term "condensable gas" refers to a gas that is normally a gas at ambient temperature and pressure inside an apparatus for producing a photocured product having a desired pattern and condenses (liquefies) in a predetermined condition in the contact stage (sealing stage) [2-2] described below. The details of the predetermined condition will be described below.

Such a condensable gas has a boiling point of −10° C. or more and 23° C. or less or a vapor pressure of 0.1 MPa or more and 0.4 MPa or less at room temperature. In particular, the condensable gas has a boiling point of 10° C. or more and 23° C. or less.

A gas having a vapor pressure of 0.4 MPa or less at room temperature readily condenses and liquefies by the capillary pressure generated by penetration of the curable composition 1 into a gap between the substrate 2 and the mold 4 or a concave on the mold 4 and thereby allows bubbles to readily disappear. A gas having a vapor pressure of 0.1 MPa or more at room temperature can be present as a gas in the apparatus without requiring a reduction in pressure and does not require a complicated apparatus.

The imprint region of an ultraviolet curable imprint apparatus is usually used at room temperature. A condensable gas having a boiling point lower than the temperature of the imprint region can maintain the gaseous state during the imprint by controlling the temperature. Such a gas, therefore, does not require the apparatus to be complicated. In the present invention and the specification, the "room temperature" is defined as a temperature of 20° C. or more and 25° C. or less.

Examples of the condensable gas include chlorofluorocarbon (CFC), fluorocarbon (FC), hydrochlorofluorocarbon (HCFC), hydrofluorocarbon (HFC), and hydrofluoroether (HFE).

Among these frons, in particular, the condensable gas can be 1,1,1,3,3-pentafluoropropane ($CHF_2CH_2CF_3$, HFC-245fa, PFP). PFP has a vapor pressure of 0.14 MPa and a boiling point of 15° C. at a room temperature (23° C.).

These condensable gases may be used alone or in combination of two or more thereof.

The gas containing a condensable gas may be the condensable gas itself or may be a gas mixture of a condensable gas and a noncondensable gas such as air, nitrogen, carbon dioxide, helium, or argon. Among these noncondensable gases to be mixed with a condensable gas, helium is an inert gas hardly inhibiting the polymerization reaction of the above-described component (B) and having an excellent filling property and can therefore be particularly used. When the noncondensable gas is helium, the helium passes through the mold and does not form bubbles. Consequently, the curable composition for photoimprint reaches every part, including the fine portions, on the surface of the mold. Thus, an excellent filling property is exhibited. Therefore, the gas containing a condensable gas can be a gas mixture of 1,1,1,3,3-pentafluoropropane and helium.

Stage [2-2] of Mold Contact

Subsequently, a mold 4 is brought into contact with the curable composition 1 for photoimprint (the layer to be subjected to shape transfer) (FIG. 1 (c1)). This stage is also called a sealing stage. In the previous stage (condensable gas-supplying stage [2-1]), the periphery of the curable composition is made into a gaseous atmosphere containing the condensable gas 3. Accordingly, this stage (contact stage) is performed in a gaseous atmosphere containing the condensable gas 3.

As shown in FIG. 1 (c1), the contact of the mold 4 with the curable composition 1 for photoimprint causes penetration of the curable composition 1 by the capillarity into a gap between the substrate 2 and the mold 4 or a concave of the fine pattern on the surface of the mold 4.

On this occasion, the condensable gas 3 present in the gap between the substrate 2 and the mold 4 or in the concave on the mold 4 condenses and liquefies by the pressure condition (the capillary pressure condition generated by the penetration of the curable composition 1 for photoimprint) that is applied to the condensable gas by the penetration of the curable composition 1. The condensation and liquefaction are also affected by the temperature condition in this stage (contact stage).

Figure 2A:
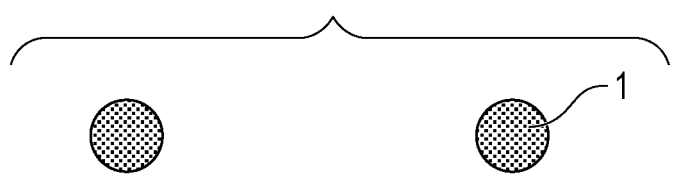
FIGS. 2A and 2B are plan views illustrating droplets of a curable composition for photoimprint arranged in a mode
Figure 2B:

The liquefaction of the condensable gas 3 reduces the volume of the condensable gas 3 present in the gap between the substrate 2 and the mold 4 and the concave on the mold 4 to one several hundredth. Thus, since the volume of the condensable gas 3 significantly reduces and can be approximated to zero, bubbles are hardly generated in the fine pattern 10 of the coating film formed from the curable composition 1 for photoimprint. As a result, the transfer accuracy of the pattern is improved. When the gas containing a condensable gas is a gas mixture of a condensable gas and a noncondensable gas, the noncondensable gas is not liquefied and is dissolved in the curable composition for photoimprint while preserving the gaseous state or passes through the mold 4. In particular, helium being used as the noncondensable gas has a small molecular weight and readily passes through the mold 4. FIGS. 2A and 2B are plan views illustrating the state of the curable composition 1 for photoimprint arranged in a mode (mode [1-1]) in which droplets of the curable composition 1 for photoimprint are arranged to be apart from one another in the arrangement step [1].

FIG. 2A is a diagram illustrating a state of the curable composition 1 for photoimprint in the arrangement step [1]; and FIG. 2B is a diagram illustrating a state of curable composition 1 for photoimprint in the mold contact step [2].

As shown in FIG. 2A, droplets of the curable composition 1 for photoimprint are arranged at three points apart from one another, and a mold (not shown) is then brought into contact with the droplets. Each droplet of the curable composition 1 moves and diffuses. On this occasion, the condensable gas present on the point 1a at which two droplets that diffuse and form a thin film come into contact with each other and on the point 1b at which three droplets that diffuse and form a thin film come into contact with one another condenses and liquefies by the pressure from the droplets of the curable composition 1 for photoimprint. As a result, bubbles are hardly generated at the points 1a and 1b.

The mold 4 should be made of a light-permeable material considering the subsequent step (light irradiation step). The material constituting the mold 4 can be, for example, glass, quartz, PMMA, a light-permeable resin such as a polycarbonate resin, a transparent metal vapor-deposited film, a flexible film made of, e.g., polydimethylsiloxane, a photo-cured film, or a metal film. When the mold 4 is made of a light-permeable resin, the resin is required not to be dissolved in the solvent contained in the curable composition 1 for photoimprint.

The mold 4 may be subjected to surface treatment for improving the releasability from the curable composition 1 for photoimprint prior to this mold contact step of bringing the mold into contact with the curable composition 1. The surface treatment is performed by, for example, applying a mold release agent to the surface of the mold 4 to form a mold release agent layer. Examples of the mold release agent for coating the surface of a mold include silicon-based mold release agents, fluorine-based mold release agents, polyethylene-based mold release agents, polypropylene-based mold release agents, paraffin-based mold release agents, montan-based mold release agents, and carnauba-based mold release agents. A commercially available coating-type mold release agent such as Optool DSX manufactured by Daikin Industries, Ltd. can also be used. These mold release agents may be used alone or in combination of two or more thereof. Among these agents, the fluorine-based mold release agents can readily reduce the mold-releasing force and are particularly used.

The pressure for bringing the mold 4 into contact with the curable composition 1 for photoimprint is not particularly limited. The time of being in contact with the mold is also not particularly limited. If the time is short, however, the curable composition 1 may insufficiently penetrate into a gap between the substrate 2 and the mold 4 or a concave (fine pattern) on the mold 4. A longer contact time decreases the productivity.

Light Irradiation Step [3]

Subsequently, as shown in FIG. 1 (d), the curable composition 1 for photoimprint at the portion being in contact with the mold 4, more specifically, the fine pattern 10 (FIG. 1 (c2)) of the coating film of the curable composition 1 filled in the fine pattern of the mold is irradiated with light via the mold 4. As a result, the coating film having the fine pattern 10 filled in the fine pattern of the mold is cured by the irradiation with light (irradiation light 5) into a cured film 11.

The light irradiated to the curable composition 1 constituting the fine pattern 10 of the coating film filled in the fine pattern of the mold is selected depending on the sensitive wavelength of the curable composition 1. Specifically, the light can be selected from, for example, ultraviolet light having a wavelength of 150 nm or more and 400 nm or less, X-rays, and electron rays.

Many of commercially available curing aids (photopolymerization initiators) show sensitivity to ultraviolet light, and therefore ultraviolet light can be particularly used as the light (irradiation light 5) to be irradiated to the coating film having the fine pattern 10. Examples of light sources emitting ultraviolet light include high-pressure mercury lamps, ultra-high pressure mercury lamps, low-pressure mercury lamps, Deep-UV lamps, carbon arc lamps, chemical lamps, metal halide lamps, xenon lamps, KrF excimer lasers, ArF excimer lasers, and $F_2$ excimer lasers. In particular, the ultra-high pressure mercury lamps can be used. The light sources may be used alone or in combination. The coating film filled in the fine pattern of the mold may be entirely irradiated with light or may be partially irradiated with light.

The light irradiation may be intermittently performed in plural times for the entire region or may be continuously performed for the entire region. Alternatively, a partial region A may be irradiated with light in a first irradiation step, and a region B other than the region A may be irradiated with light in a second irradiation step.

When the curable composition 1 for photoimprint also has a thermosetting property, thermal curing may be further performed during the light irradiation or after the light irradiation but before the mold-releasing step. The thermosetting may be performed in any heating atmosphere and at any heating temperature. For example, the thermosetting can be performed by heating at 40° C. or more and 200° C. or less in an inert atmosphere or at reduced pressure. The heating can be performed using, for example, a hot plate, an oven, or a furnace.

Mold-Releasing Step [4]

Subsequently, the mold 4 is released from the cured film 11 to give a cured product 12 having a predetermined pattern on the substrate 2.

In this step (mold-releasing step), as shown in FIG. 1 (e), the mold 4 is released from the cured film 11 to give a cured product 12 having a pattern inverted from the fine pattern on the surface of the mold 4 in the step [3] (light irradiation step).

The mold 4 may be released from the cured film 11 by any method that does not physically break a part of the cured film 11, and the conditions for the releasing are not particularly limited. For example, the mold 4 may be released by fixing the substrate 2 (substrate to be machined) and moving the mold 4 so as to be separated from the substrate 2; or by fixing the mold 4 and moving the substrate 2 so as to be separated from the mold 4; or pulling the both in opposite directions from each other.

The producing process including the steps [1] to [4] can provide a cured product 12 having a desired concavo-convex pattern (based on the concavo-convex pattern of the mold 4). The pattern intervals of the concavo-convex pattern of the cured product 12 are defined by the pattern intervals of the concavo-convex pattern on the surface of the mold 4.

The pattern intervals of the concavo-convex pattern on the surface of the mold 4 can be appropriately set. Specifically, the pattern intervals can be appropriately set with a millimeter order, a micrometer order (including a submicron order), or a nanometer order. For example, in a concavo-convex pattern with a nanometer order, a pattern can be formed at a pattern intervals of 20 nm or less.

When the area of the mold 4 is smaller than that of the substrate 2, a part of the curable composition 1 for photoimprint applied onto the substrate 2 is not in contact with the mold 4. In such a case, the producing process composed of the steps [1] to [4] is repeated at different regions on the substrate 2 by appropriately moving the mold 4. That is, the producing process composed of the steps [1] to [4] is defined as one shot, and the shot is repeated on the curable composition 1 for photoimprint on the substrate 2. Thus, a plurality of cured products 12 each having the pattern based on the concavo-convex pattern of the mold 4 can be formed on the substrate 2.

The cured product 12 having a pattern can also be used as an optical member (including a case of being used as a part constituting an optical member) such as a Fresnel lens or a diffraction grating. In such a case, the optical member at least includes the substrate 2 and the cured product 12 having a pattern formed on the substrate 2.

Etching Step [5]

The cured product prepared in the mold-releasing step [4] has a specific pattern, and a part of the cured film may also remain at a region other than the region having the pattern (hereinafter, such the part of the film may be called residual film). In such a case, as shown in FIG. 1 (f), the cured film (residual film), which is the region that should be removed from the resulting cured film having a pattern, is removed to give a patterned cured product 13 having a desired concavo-convex pattern (based on the pattern of the mold 4).

For example, the film (residual film), which is a concave of the cured product 12 having the pattern, is removed by a method such as etching to expose the surface of the substrate 2 at the concave of the pattern of the cured product 12 having the pattern.

The etching for removing the film at the concave of the pattern provided to the cured product 12 can be performed by any known method such as dry etching. The dry etching can be performed with a known dry etching apparatus. The source gas for dry etching is appropriately selected depending on the elemental composition of the cured film to be etched. Examples of the source gas include halogen gases such as $CF_4$, $C_2F_6$, $C_3Fe$, $CCl_2F_2$, $CCl_4$, $CBrF_3$, $BCl_3$, $PCl_3$, $SF_6$, and $Cl_2$; oxygen-containing gases such as $O_2$, CO, and $CO_2$; inert gases such as He, $N_2$, and Ar; and gases such as $H_2$ and $NH_3$. These gases may be used as a mixture thereof.

The producing process composed of the steps [1] to [5] can provide a patterned cured product 13 having a desired concavo-convex pattern (based on the concavo-convex pattern of the mold 4) and can thus provide an article having a patterned cured product. Furthermore, when the substrate 2 is processed using the resulting patterned cured product 13, a substrate-processing step (step [6]) described below is performed.

Alternatively, the resulting patterned cured product 13 can be used as an optical member (including a case of being used as a partial component constituting an optical member) such as a diffraction grating or a polarizing plate to provide an optical component. In such a case, an optical component at least including a substrate 2 and a patterned cured product 13 on the substrate 2 can be provided.

Substrate-Processing Step [6]

The patterned cured product 13 having a concavo-convex pattern prepared by the method of producing a film having a pattern of this embodiment can also be used as an interlayer insulating film of an electronic component represented by a semiconductor device such as an LSI, system LSI, DRAM, SDRAM, RDRAM, or D-RDRAM or as a film of the curable composition for photoimprint in the production of semiconductor devices.

When the patterned cured product 13 is used as a film of the curable composition for photoimprint, a circuit structure 20 (FIG. 1 (g)), which is used for, for example, a semiconductor device, can be produced on the substrate 2 based on the pattern of the patterned cured product 13 by, for example, etching or ion implantation of a part (the region 111 in FIG. 1 (f)) of the substrate surface exposed in the etching step [5] to provide an electronic member. On this occasion, the patterned cured product 13 functions as a mask. Alternatively, an electronic component (electronic device) can also be produced by providing a circuit controlling mechanism that controls the circuit board and connecting the mechanism to the circuit board.

When a circuit board or an electronic component is produced, the patterned cured product 13 may be finally removed from the processed substrate or may be left as a member constituting the device.

EXAMPLES

The present invention will now be described in more detail by means of examples, but the technical scope of the present invention is not limited to the examples described below. The "part(s)" and "%" used below are based on weight unless otherwise mentioned.

Example 1

Measurement of Saturated Solubility of Component (B) in Liquid Condensable Gas

The saturated solubility of Lucirin TPO (manufactured by BASF) serving as component (B) at 5° C. in a condensable gas, 1,1,1,3,3-pentafluoropropane (PFP), being a liquid at 5° C. and 1 atm was measured.

Lucirin TPO is 2,4,6-trimethylbenzoyldiphenylphosphine oxide represented by Formula (1):

[Chem. 7]

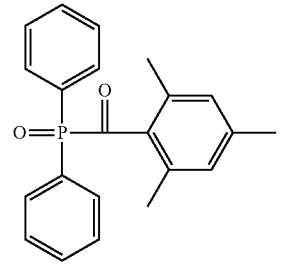

Formula (1)

Lucirin TPO (0.052 g) was weighed in a sample bottle at 23° C., and PFP cooled to 5° C. to a liquid state was gradually added to the bottle until the total amount became 5.3 g. The Lucirin TPO was not completely dissolved. The sample bottle was capped and was left to stand in a refrigerator at 5° C. for 1 hour. The sample bottle was then visually observed. Since the Lucirin TPO was not completely dissolved, the saturated solubility of Lucirin TPO at 5° C. in PFP being a liquid state at 5° C. and 1 atm was less than 1% by weight.

Calculation of Hansen Distance (Ra) Between Condensable Gas and Component (A)

The Hansen distance (Ra) between component (A), a mixture of (A-1) to (A-3) at the ratio shown below, and the condensable gas, PFP, was 4.7 when calculated with software Hansen Solubility Parameters in Practice (HSPiP), 4th Edition 4.0.05.

Calculation of Hansen Distance (Ra) Between Condensable Gas and Component (B)

The Hansen distance (Ra) between Lucirin TPO and a condensable gas, 1,1,1,3,3-pentafluoropropane (PFP), was 9.4 when calculated similarly to the above.

Preparation of Curable Composition for Photoimprint

A solution was prepared by mixing the following components (A) to (C):

Polymerizable compound component (A) (total amount: 94 parts by weight):

(A-1) Isobornyl acrylate (manufactured by Kyoeisha Chemical Co., Ltd., trade name: IB-XA): 9.0 parts by weight, (A-2) Benzyl acrylate (manufactured by Osaka Organic Chemical Industry Ltd., trade name: V#160): 38.0 parts by weight, and (A-3) Neopentylglycol diacrylate (manufactured by Kyoeisha Chemical Co., Ltd., trade name: NP-A): 47.0 parts by weight Photopolymerization initiator component (B):

(B-1) Lucirin TPO (manufactured by BASF): 3 parts by weight

Other component (C):

(C-1) BLAUNON SR-730 (manufactured by Aoki Oil Industrial Co., Ltd.): 1.6 parts by weight.

Subsequently, the resulting solution was filtered through an ultra-high molecular weight polyethylene filter of a pore size of 5 nm to prepare curable composition 1 for photoimprint of this example (Example 1).

Observation of Nanoimprint Pattern

Subsequently, a nanoimprint pattern of the curable composition 1 for photoimprint was formed by the method shown below and was observed with an electron microscope.

(1) Nanoimprint in a Helium Atmosphere
(1-1) Arrangement Step

Droplets (11 pL per droplet, 1440 droplets in total) of the curable composition 1 for photoimprint were dropwise applied onto a 300-mm silicon wafer provided with an adhesion-accelerating layer having a thickness of 3 nm as an adhesion layer by ink jetting. The dropwise application of the droplets was performed in a region measuring 26 mm in length and 33 mm in width such that the intervals of each droplet were approximately equal.

(1-2) Mold Contact Step and Light Irradiation Step

Subsequently, a quartz mold (length: 26 mm, width: 33 mm) provided with 28 nm line and space (L/S) patterns but not subjected to surface treatment was brought into contact with the curable composition 1 for photoimprint on the silicon wafer.

Subsequently, the curable composition for photoimprint was irradiated with UV light through the quartz mold after 30 seconds from the contact of the quartz mold to the curable composition by a UV light source (EXECURE 3000, manufactured by HOYA CANDEO OPTRONICS Corporation) equipped with a 200-W mercury-xenon lamp. In irradiation of UV light, an interference filter (VPF-50C-10-25-31300, manufactured by Sigma Koki Co., Ltd.) selectively transmitting light of a wavelength of 313±5 nm was disposed between the UV light source and the quartz mold. The illumination of the UV light directly under the quartz mold was 30 mW/cm$^2$ at a wavelength of 313 nm. Irradiation of UV light was performed under the above-described conditions for 5 seconds (light exposure amount: 150 mJ/cm$^2$).

(1-3) Mold-Releasing Step

Subsequently, the quartz mold was pulled up at a speed of 0.5 mm/sec to release the mold from the photocured film.

(1-4) Observation of Nanoimprint Pattern with Electron Microscope

Observation of the nanoimprint pattern with an electron microscope demonstrated that a satisfactory pattern having no defect such as pattern collapse was formed.

(2) Nanoimprint in Atmosphere Containing Condensable Gas (2-1) Arrangement Step

Dropwise application of the curable composition 1 for photoimprint was performed in a helium atmosphere as in (1-1) Arrangement Step.

(2-2) Mold Contact Step and Light Irradiation Step

Contact of a quartz mold and irradiation of UV light were performed as in (1-2) mold contact step and light irradiation step except that a gas mixture of helium and a condensable gas PFP at a flow rate ratio of 1:4 was used instead of helium.

(2-3) Mold-Releasing Step

The mold was released from the photocured film as in (1-3) mold-releasing step.

(2-4) Observation of Nanoimprint Pattern with Electron Microscope

Observation of the nanoimprint pattern with an electron microscope demonstrated that a satisfactory pattern having no defect such as pattern collapse was formed.

Example 2

The saturated solubility of IRGACURE 369 (manufactured by BASF) serving as component (B) at 5° C. in a condensable gas, 1,1,1,3,3-pentafluoropropane (PFP), being a liquid at 5° C. and 1 atm was measured.

IRGACURE 369 is (2-benzyl-2-dimethylamino-4'-morpholinobutyrophenone) represented by Formula (1):

[Chem. 8]

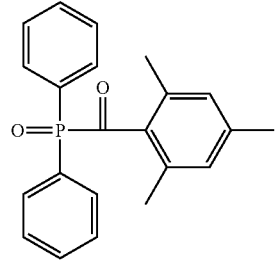

Formula (1)

IRGACURE 369 (0.052 g) was weighed in a sample bottle at 23° C., and PFP cooled to 5° C. to a liquid state was gradually added to the bottle until the total amount became 5.3 g. The IRGACURE 369 was not completely dissolved. The sample bottle was capped and was left to stand in a refrigerator at 5° C. for 1 hour. The sample bottle was then visually observed. Since the IRGACURE 369 was not completely dissolved, the saturated solubility of IRGACURE 369 at 5° C. in PFP being a liquid state at 5° C. and 1 atm was less than 1% by weight.

Calculation of Hansen Distance (Ra) Between Condensable Gas and Component (A)

The Hansen distance (Ra) between component (A), a mixture of (A-1) to (A-4) at the ratio shown below, and the condensable gas, PFP, was 5.3 when calculated as in Example 1.

Calculation of Hansen Distance (Ra) Between Condensable Gas and Component (B)

The Hansen distance (Ra) between IRGACURE 369 (manufactured by BASF) and a condensable gas, 1,1,1,3,3-pentafluoropropane (PFP), was 8.7 when calculated as in Example 1.

Preparation of Curable Composition for Photoimprint

A solution was prepared by mixing the following components (A) to (C):

Polymerizable compound component (A) (total amount: 100 parts by weight):

(A-1) Isobornyl acrylate (manufactured by Kyoeisha Chemical Co., Ltd., trade name: IB-XA): 75 parts by weight, and (A-4) 1,10-Decanediol acrylate (manufactured by Shin-Nakamura Chemical Co., Ltd., trade name: A-DOD-N): 25 parts by weight Photopolymerization initiator component (B):

(B-1) IRGACURE 369 (manufactured by BASF): 3 parts by weight

Other component (C):

(C-1) BLAUNON SR-705 (manufactured by Aoki Oil Industrial Co., Ltd.): 0.5 parts by weight.

Subsequently, the resulting solution was filtered through an ultra-high molecular weight polyethylene filter of a pore size of 5 nm to prepare curable composition 2 for photoimprint of this example (Example 2).

Observation of Nanoimprint Pattern

Subsequently, a nanoimprint pattern of the curable composition 2 for photoimprint was formed by the method as in Example 1 and was observed with an electron microscope. In the atmosphere of helium and the atmosphere of the gas mixture of helium and PFP, satisfactory patterns having no defect such as pattern collapse were formed.

Example 3

Calculation of Hansen Distance (Ra) Between Condensable Gas and Component (A)

The Hansen distance (Ra) between component (A), a mixture of (A-5) and (A-6) at the ratio shown below, and the condensable gas, PFP, was 5.6 when calculated as in Example 1.

Calculation of Hansen Distance (Ra) Between Condensable Gas and Component (C)

The Hansen distance (Ra) between component (C), 4,4'-bis(diethylamino)benzophenone (manufactured by Tokyo Chemical Industry Co., Ltd.), and a condensable gas, 1,1,1,3,3-pentafluoropropane (PFP), was 7.8. 4,4'-Bis(diethylamino)benzophenone is represented by Formula (4):

[Chem. 9]

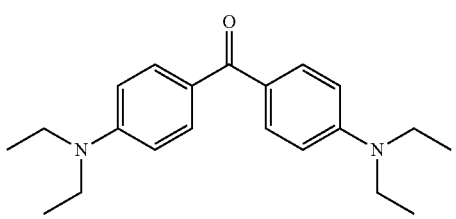

Formula (4)

Preparation of Curable Composition for Photoimprint

A solution was prepared by mixing the following components (A) to (C):

Polymerizable compound component (A) (total amount: 100 parts by weight):

(A-5) Dicyclopentanyl acrylate (manufactured by Hitachi Chemical Company, Ltd., trade name: FA-513AS): 50 parts by weight, and (A-6) Meta-xylylene diacrylate (manufactured by Nard Institute, Ltd.): 50 parts by weight, where meta-xylylene diacrylate is represented by Formula (5):

[Chem. 10]

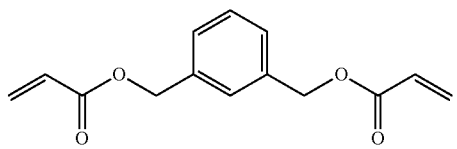

Formula (5)

Photopolymerization initiator component (B):

(B-1) Lucirin TPO (manufactured by BASF) represented by Formula (1): 3 parts by weight Sensitizer component (C):

(C-1) 4,4'-Bis(diethylamino)benzophenone (manufactured by Tokyo Chemical Industry Co., Ltd.) represented by Formula (4): 0.5 parts by weight.

Subsequently, the resulting solution was filtered through an ultra-high molecular weight polyethylene filter of a pore size of 5 nm to prepare curable composition 3 for photoimprint of this example (Example 3).

Observation of Nanoimprint Pattern

Subsequently, a nanoimprint pattern of the curable composition 3 for photoimprint was formed by the method as in Example 1 and was observed with an electron microscope. In the atmosphere of helium and the atmosphere of the gas mixture of helium and PFP, satisfactory patterns having no defect such as pattern collapse were formed.

Example 4

Preparation of Curable Composition for Photoimprint

A solution was prepared by mixing the following components (A) and (B):

Polymerizable compound component (A) (total amount: 100 parts by weight):

(A-5) Dicyclopentanyl acrylate (manufactured by Hitachi Chemical Company, Ltd., trade name: FA-513AS): 50 parts by weight, and (A-6) Meta-xylylene diacrylate (manufactured by Nard Institute, Ltd.) represented by Formula (5): 50 parts by weight Photopolymerization initiator component (B):

(B-1) IRGACURE 369 (manufactured by BASF) represented by Formula (2): 3 parts by weight.

Subsequently, the resulting solution was filtered through an ultra-high molecular weight polyethylene filter of a pore size of 5 nm to prepare curable composition 4 for photoimprint of this example (Example 4).

Observation of Nanoimprint Pattern

Subsequently, a nanoimprint pattern of the curable composition 4 for photoimprint was formed by the method as in Example 3 and was observed with an electron microscope. In the atmosphere of helium and the atmosphere of the gas mixture of helium and PFP, satisfactory patterns having no defect such as pattern collapse were formed.

Comparative Example 1

Measurement of Saturated Solubility of Component (B) in Liquid Condensable Gas

The saturated solubility of IRGACURE 651 (manufactured by BASF) serving as component (B) at 5° C. in a condensable gas, PFP, being a liquid at 5° C. and 1 atm was measured.

IRGACURE 651 is a compound (benzyl dimethyl ketal) represented by Formula (6):

[Chem. 11]

Formula (6)

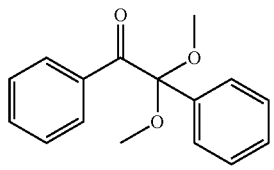

IRGACURE 651 (0.051 g) was weighed in a sample bottle at 23° C., and PFP cooled to 5° C. to a liquid state was gradually added to the bottle until the total amount became 1.9 g. The IRGACURE 651 was completely dissolved. The sample bottle was capped and was left to stand in a refrigerator at 5° C. for 1 hour. The sample bottle was then visually observed. Since the IRGACURE 651 was still completely dissolved, the saturated solubility of IRGACURE 651 at 5° C. in PFP being a liquid state at 5° C. and 1 atm was higher than 2.67% by weight.

Calculation of Hansen Distance (Ra) Between Condensable Gas and Component (B)

The Hansen distance (Ra) between IRGACURE 651 and a condensable gas, 1,1,1,3,3-pentafluoropropane (PFP), was 7.6 when calculated as in Example 1.

Preparation of Curable Composition for Photoimprint

Curable composition 2 for photoimprint was prepared as in Example 1 except that IRGACURE 651 was used in the place of photopolymerization initiator component (B) in Example 1.

Observation of Nanoimprint Pattern

Subsequently, a nanoimprint pattern of the curable composition 2 for photoimprint was formed by the method as in Example 1 and was observed with an electron microscope. Although a satisfactory pattern having no defect such as pattern collapse was formed in the atmosphere of helium, in the atmosphere of the gas mixture of helium and PFP, defects such as pattern collapse were observed in 50% or more of the pattern.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-035845, filed Feb. 26, 2014 and No. 2014-109340 filed May 27, 2014 and No. 2014-257800 filed Dec. 19, 2014, which are hereby incorporated by reference herein in their entirety.

The invention claimed is:

1. A method of producing a film having a pattern, the method comprising:
arranging a curable composition for photoimprint on a substrate;
bringing a mold having a mold pattern for transfer into contact with the curable composition for photoimprint in a gaseous atmosphere containing a condensable gas;
irradiating the curable composition with light to form a cured film; and
releasing the mold from the cured film,
wherein the curable composition for photoimprint is a curable composition for photoimprint in a gaseous atmosphere containing a condensable gas, the curable composition at least comprising component (A) and component (B):
(A) polymerizable compound; and
(B) photopolymerization initiator,
wherein component (B) has a saturated solubility of less than 1% by weight in the condensable gas in a liquid state at 5° C. and 1 atm or has a Hansen distance (Ra) of larger than 7.6 to the condensable gas.

2. The method of producing a film having a pattern according to claim 1, wherein the gas containing a condensable gas is a gas mixture of a condensable gas and a noncondensable gas.

3. The method of producing a film having a pattern according to claim 2, wherein the noncondensable gas is an inert gas.

4. The method of producing a film having a pattern according to claim 2, wherein the noncondensable gas is helium.

5. The method of producing a film having a pattern according to claim 1, wherein the condensable gas is a chlorofluorocarbon, a fluorocarbon, a hydrochlorofluorocarbon, a hydrofluorocarbon, or a hydrofluoroether.

6. The method of producing a film having a pattern according to claim 1, wherein the condensable gas is 1,1,1,3,3-pentafluoropropane.

7. The method of producing a film having a pattern according to claim 1, wherein the condensable gas condenses and liquefies by a pressure of the condensable gas when the curable composition for photoimprint penetrates into a gap between the substrate and the mold or into a concave of the fine pattern on the surface of the mold in the step of bringing the mold into contact with the curable composition.

8. The method of producing a film having a pattern according to claim 1, wherein the mold pattern of the mold has a quartz surface.

9. A method of producing an optical component, the method comprising:
producing a film having a pattern on a substrate by a method of producing a film according to claim 1.

10. A method of producing an optical component, the method comprising:
producing a film having a pattern on a substrate by a method of producing a film according to claim 1; and
subjecting the substrate to etching or ion implantation using the film having a pattern as a mask.

11. A method of producing a circuit board, the method comprising:
producing a film having a pattern on a substrate by a method of producing a film according to claim 1;
subjecting the substrate to etching or ion implantation using the film having a pattern as a mask; and
forming an electronic member.

12. A method of producing an electronic component, the method comprising:
producing a circuit board by the method of producing a circuit board according to claim 11; and connecting the circuit board to a control mechanism for controlling the circuit board.

13. The method of producing a film having a pattern according to claim 1, wherein component (A) is a (meth) acrylic monomer.

14. The method of producing a film having a pattern according to claim 1, wherein component (A) includes a monofunctional (meth)acrylic monomer and a polyfunctional (meth)acrylic monomer.

15. The method of producing a film having a pattern according to claim 1, wherein component (A) has a Hansen distance (Ra) of larger than 4.0 to the condensable gas.

16. The method of producing a film having a pattern according to claim 1, wherein the gas containing the condensable gas is a gas mixture of a condensable gas and helium.

17. The method of producing a film having a pattern according to claim 1, wherein the condensable gas is a chlorofluorocarbon, a fluorocarbon, a hydrochlorofluorocarbon, a hydrofluorocarbon, or a hydrofluoroether.

18. The method of producing a film having a pattern according to claim 1, wherein component (B) is an acylphosphine oxide compound.

19. The method of producing a film having a pattern according to claim 18, wherein component (B) is represented by Formula (1):

[Chem. 1]

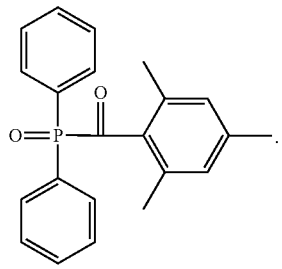

Formula (1)

20. The method of producing a film having a pattern according to claim 1, wherein component (B) is an aminoalkylphenone compound.

21. The method of producing a film having a pattern according to claim 20, wherein component (B) is represented by Formula (2):

[Chem. 2]

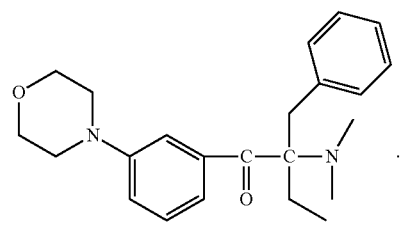

Formula (2)

22. The method of producing a film having a pattern according to claim 1, further comprising component (C):
(C) sensitizer,
wherein component (C) has a Hansen distance (Ra) of larger than 7.6 to the condensable gas.

23. The method of producing a film having a pattern according to claim 22, wherein component (C) is a benzophenone compound.

24. The method of producing a film having a pattern according to claim 22, wherein component (C) is represented by Formula (4):

[Chem. 4]

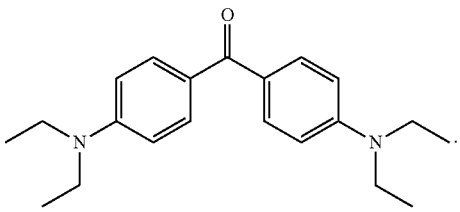

Formula (4)

* * * * *